(12) United States Patent
Teraguchi

(10) Patent No.: US 7,898,335 B2
(45) Date of Patent: Mar. 1, 2011

(54) AMPLIFIER CIRCUIT

(75) Inventor: Takayuki Teraguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 12/464,175

(22) Filed: May 12, 2009

(65) Prior Publication Data

US 2010/0007422 A1    Jan. 14, 2010

(30) Foreign Application Priority Data

Jul. 10, 2008    (JP) .............................. 2008-180249

(51) Int. Cl.
*H03G 3/30*    (2006.01)

(52) U.S. Cl. .................. 330/285; 330/288; 330/296
(58) Field of Classification Search .................. 330/285, 330/288, 296
See application file for complete search history.

(56) References Cited

U.S. PATENT DOCUMENTS

| 6,043,714 A | * | 3/2000 | Yamamoto et al. | .......... 330/296 |
| 7,245,184 B2 | * | 7/2007 | Ishikawa et al. | ............ 330/296 |
| 7,477,106 B2 | * | 1/2009 | Van Bezooijen et al. | .... 330/296 |

FOREIGN PATENT DOCUMENTS

| JP | 09-283576 | 10/1997 |
| JP | 2002-009118 | 1/2002 |
| JP | 2005-057002 | 3/2005 |

* cited by examiner

*Primary Examiner*—Khanh V Nguyen
(74) *Attorney, Agent, or Firm*—Turocy & Watson, LLP

(57) ABSTRACT

There is provided an amplifier circuit includes: an amplifying transistor; a first transistor having a DC current amplification factor generally equal to the DC current amplification factor of the amplifying transistor and constituting a current mirror circuit in conjunction with the amplifying transistor; and a current source circuit being operable to supply a current to the first transistor and including a second transistor having opposite conductivity type to the conductivity type of the first transistor. The second transistor is operated in a saturation region at a power supply voltage lower than an operating voltage range so that the DC current amplification factor of the amplifying transistor can be detected.

13 Claims, 4 Drawing Sheets

AMPLIFIER CIRCUIT

CROSS-REFERENCE TO RELATED APPLICATIONS

This application is based upon and claims the benefits of priority from the prior Japanese Patent Application No. 2008-180249, filed on Jul. 10, 2008; the entire contents of which are incorporated herein by reference.

BACKGROUND OF THE INVENTION

1. Field of the Invention
This invention relates to an amplifier circuit.
2. Background Art
Low-noise radio-frequency amplifiers constituting mobile electronic devices require small size, low noise, and mass productivity. Integration of amplifier circuits including radio-frequency transistors on a silicon substrate facilitates ensuring mass productivity while maintaining low noise figure (NF) in the radio-frequency band.

Here, the radio-frequency characteristics depend primarily on the characteristics of the radio-frequency transistor. However, the radio-frequency transistor is incorporated in the amplifier circuit, and separately measuring its characteristics requires providing measuring terminals. However, such measuring terminals increase chip size and decrease mass productivity.

JP-A-9-283576 (1997) (Kokai) discloses a technique related to a semiconductor device that allows dark current measurement in the chip state. In this technique, a probe test electrode is connected to the base electrode of a transistor. A probe is brought into contact with the base electrode to measure DC current amplification factor ($h_{FE}$). Then, a forward current is passed between the collector and the emitter to blow the interconnected portion between the base electrode and the probe test electrode, and the collector-emitter dark current is measured.

However, even using this technique, the DC current amplification factor of a transistor incorporated in an amplifier circuit is difficult to measure, and the amplification characteristics need to be directly measured in the delivery inspection of products.

SUMMARY OF THE INVENTION

According to an aspect of the invention, there is provided an amplifier circuit including: an amplifying transistor; a first transistor having a DC current amplification factor generally equal to the DC current amplification factor of the amplifying transistor and constituting a current mirror circuit in conjunction with the amplifying transistor; and a current source circuit being operable to supply a current to the first transistor and including a second transistor having opposite conductivity type to the conductivity type of the first transistor, the second transistor being operated in a saturation region at a power supply voltage lower than an operating voltage range so that the DC current amplification factor of the amplifying transistor can be detected.

According to another aspect of the invention, there is provided an amplifier circuit including: an amplifying transistor; a first transistor having a DC current amplification factor generally equal to the DC current amplification factor of the amplifying transistor and constituting a current mirror circuit in conjunction with the amplifying transistor; a current source circuit being operable to supply a current to the first transistor and including a second transistor having opposite conductivity type to the conductivity type of the first transistor; and a comparator to which collector potential and emitter potential of the second transistor are inputted, the second transistor being operated in a saturation region at a power supply voltage lower than an operating voltage range so that the DC current amplification factor of the amplifying transistor can be detected.

According to another aspect of the invention, there is provided an amplifier circuit including: an amplifying transistor; a first transistor having a DC current amplification factor generally equal to the DC current amplification factor of the amplifying transistor and constituting a current mirror circuit in conjunction with the amplifying transistor; a current source circuit being operable to supply a current to the first transistor and including a second transistor having opposite conductivity type to the conductivity type of the first transistor; a comparator to which collector potential and emitter potential of the second transistor are inputted; and an inverter operable to invert an output of the comparator, the second transistor being operated in a saturation region at a power supply voltage lower than an operating voltage range so that the DC current amplification factor of the amplifying transistor can be detected.

DETAILED DESCRIPTION OF THE INVENTION

Embodiments of the invention will now be described with reference to the drawings.

Figure 1:
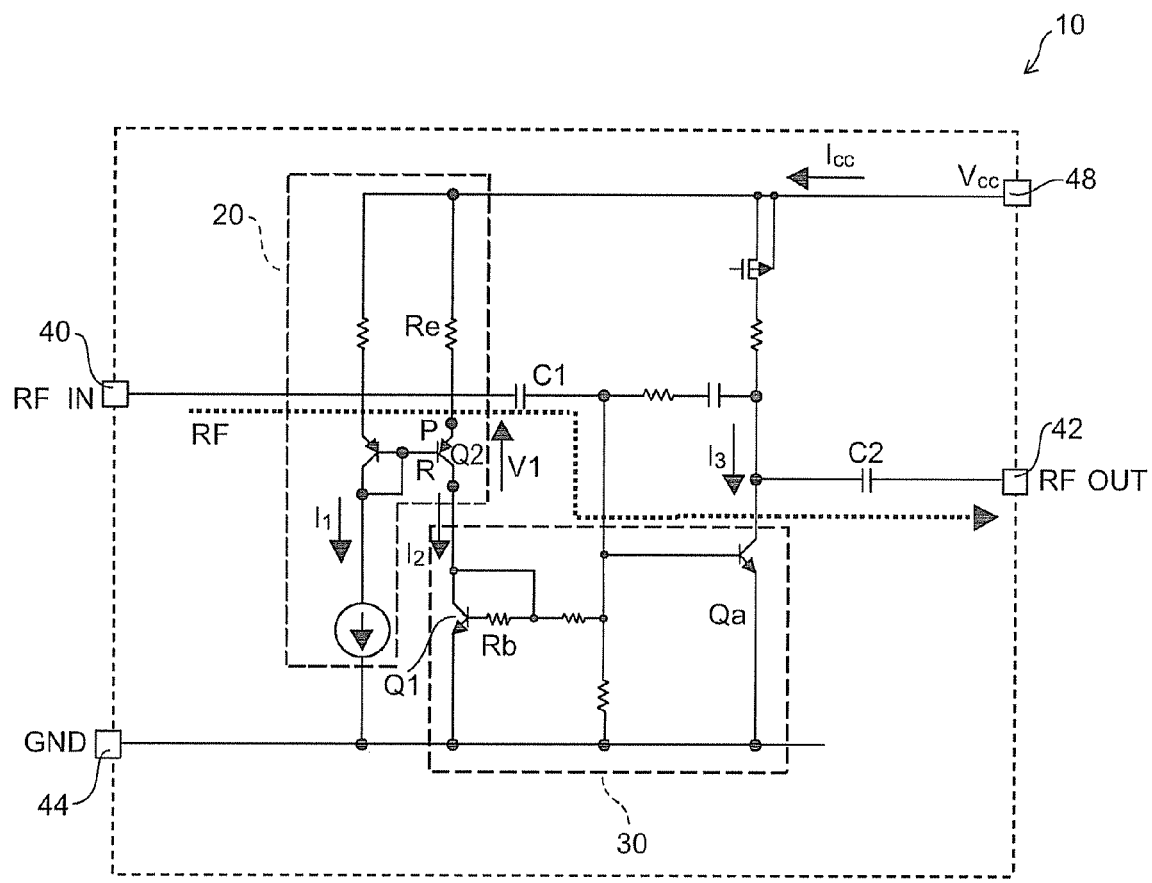
FIG. 1 is a circuit diagram of an amplifier circuit according to a first embodiment of the invention.

FIG. 1 is a circuit diagram of an amplifier circuit according to a first embodiment of the invention. Although this embodiment illustrates a radio-frequency low-noise amplifier circuit, the invention is not limited thereto.

A radio-frequency (RF) signal is inputted to an input terminal 40 and passes through a capacitor C1, an amplifying transistor Qa, and a capacitor C2 as indicated by the dotted line, and the amplified RF signal is extracted outside from an output terminal 42. The ground of the amplifier circuit 10 chip is connected to a ground terminal 44. For example, in the case of a mobile electronic device, the RF signal has a frequency range from 800 MHz to 2.5 GHz. In the case of use as a receiver front end, the noise figure (NF) is required to be as low as 0.7 to 1 dB, for example.

In front-end applications, the DC bias point of the amplifying transistor is preferably at low voltage and low current so that the RF signal has small amplitude and low NF. For example, in a SiGe heterobipolar transistor, the maximum rating of collector-emitter voltage $V_{CEO}$ is illustratively 3 V, and the collector current minimizing NF is illustratively 5 mA.

To set the DC bias point like this, the amplifier circuit 10 illustratively includes a current source circuit 20, an amplifying transistor Qa, and a first transistor Q1. The current source circuit 20 is assumed to include a current mirror circuit composed of transistors having the opposite conductivity type to the amplifying transistor Qa. That is, if the first transistor Q1 is of the NPN type, the second transistor Q2 is of the PNP type.

The current $I_2$ from the current source circuit 20 driven by a power supply voltage Vcc is supplied to the first transistor Q1. The first transistor Q1 and the amplifying transistor Qa are both NPN transistors and constitute a current mirror circuit having a prescribed ratio. Hence, the current $I_2$ of the first transistor Q1 is copied with this ratio to supply a current $I_3$ to the amplifying transistor Qa.

Preferably, the amplifying transistor Qa and the first transistor Q1 are formed in close proximity so as to have a generally equal DC current amplification factor and maintain good pair matching. Furthermore, the current ratio between the amplifying transistor Qa and the first transistor Q1 can be controlled by varying the size ratio of the transistors. For example, the size ratio is preferably selected to be 10:1 because the first transistor Q1 can be downsized to reduce power consumption.

The bias condition of the amplifying transistor Qa is configured so as to minimize NF while ensuring a desired gain at a desired frequency.

Figure 2:
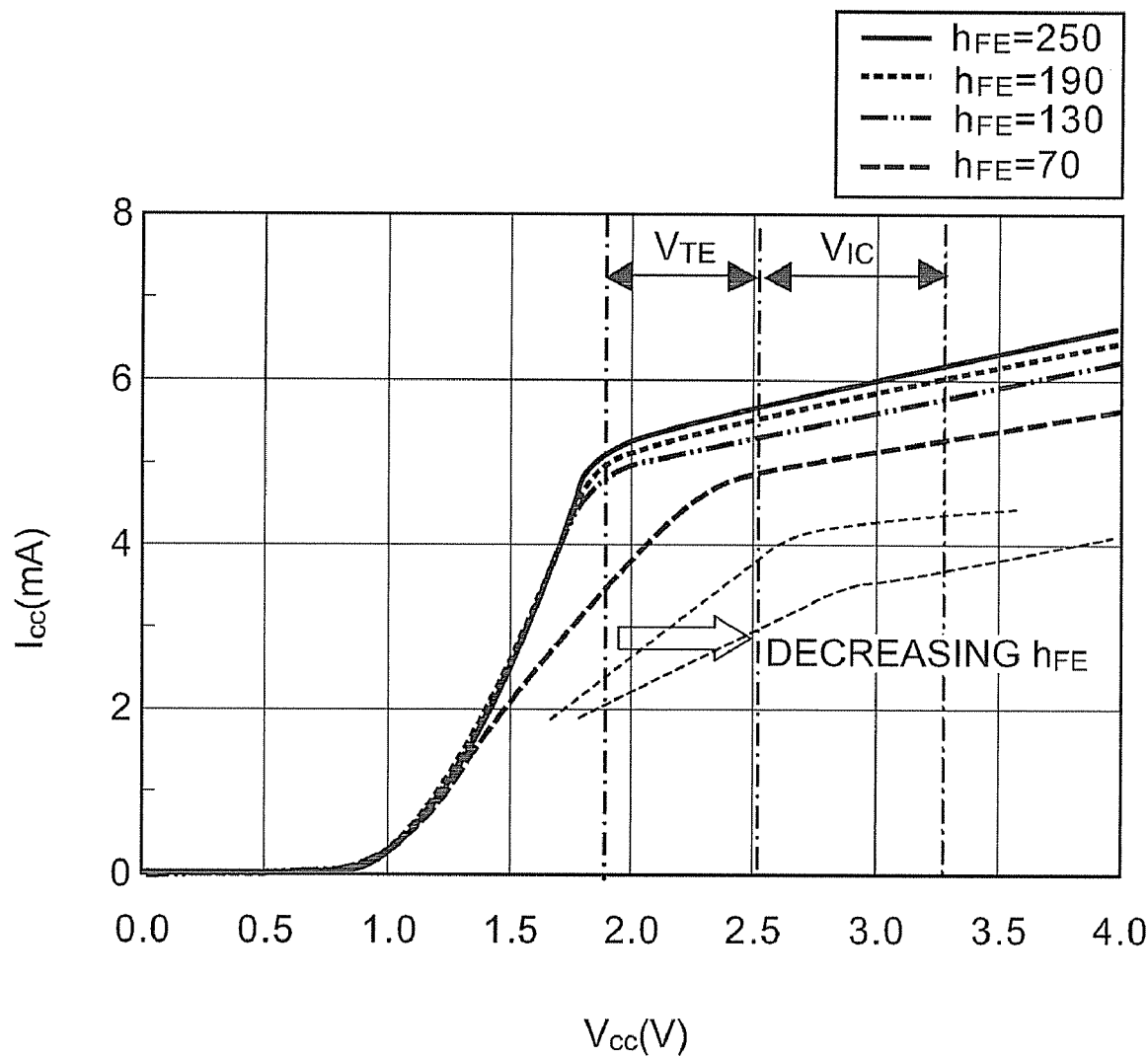
FIG. 2 is a graph illustrating the operation of the amplifier circuit.

FIG. 2 is a graph illustrating the operation of the amplifier circuit. The vertical axis represents the operating current Icc (mA) of the amplifier circuit 10, and the horizontal axis represents the power supply voltage Vcc (V) supplied to the amplifier circuit. Application of the power supply voltage Vcc allows $I_1$ and $I_2$ to flow through the current source 20, and the current $I_2$ is copied by the current mirror circuit 30 to supply a current $I_3$ to the amplifying transistor Qa. That is, the following equation holds among these currents.

$$Icc = I_1 + I_2 + I_3$$

If the ratio between Qa and Q1 is 10:1, then $I_3 > I_2$ and $I_3 > I_1$ can be satisfied.

The collector-emitter voltage V1 between the collector (point R) and the emitter (point P) of the second transistor Q2 (PNP type) constituting the current source circuit 20 is given by the following equation:

$$V1 = Vcc - [I_2 \times (Re + Rb/h_{FE}) + Vf]$$

where Vcc is the power supply voltage, Re is the resistance between Q2 and the power supply terminal, Rb is the resistance between the base and the collector of Q1, and Vf is the base-emitter forward voltage of Q1.

With the increase of the resistance Rb between the base and the collector of the first transistor Q1, the collector voltage of Q1 increases, and the collector-emitter voltage V1 of the second transistor Q2 decreases. Hence, when the power supply voltage Vcc is in the range $V_{TE}$, which is lower than the operating voltage range $V_{IC}$ of the amplifier circuit, the second transistor Q2 is operated in the saturation region. Here, the collector-emitter saturation voltage of the second transistor Q2 is illustratively 0.1 to 0.25 V.

In FIG. 2, the operating voltage range $V_{IC}$ as an amplifier circuit is illustratively the range from 2.5 to 3.3 V. The voltage range $V_{TE}$ lower than $V_{IC}$ can illustratively be set to the range from 1.8 to 2.4 V by suitably determining the resistance Rb.

Suppose that the power supply voltage Vcc is gradually increased to Vcc=2.0 V. If $h_{FE} > 130$, then Icc>5.8 mA, and the slope of the operating current Icc with respect to the power supply voltage Vcc in the operating voltage range $V_{IC}$ is generally equal to the slope at Vcc=2 V.

On the other hand, if $h_{FE} = 70$, then the equation for V1 dictates that the second transistor Q2 is in the saturation region. Hence, because the current $I_2$ is not sufficiently supplied, the amplifying transistor Qa is not sufficiently supplied with the current $I_3$. Thus, as shown in FIG. 2, at Vcc=2 V, the operating current Icc is less than generally 3.7 mA.

If the power supply voltage Vcc is further increased and exceeds 2.5 V, the second transistor Q2 exits the saturation region so that the current mirror circuit 30 can sufficiently supply the current $I_2$, and Icc continues to increase. Hence, in the voltage range $V_{TE}$, by measuring the operating current Icc of the chip amplifier circuit in the wafer state to determine the slope thereof, the amplifier circuit with low $h_{FE}$ can be easily screened out. Here, the inspection voltage can be determined in the voltage range $V_{TE}$ in an analog fashion.

Typically, in the vicinity of the operating frequency of a low-noise transistor used for a receiver front end, NF can be made generally flat with respect to frequency. Using a noise equivalent circuit of a bipolar transistor, NF can be illustratively given by equation (1):

$$NF = \log_{10}\left(1 + \frac{1}{\sqrt{h_{FE}}} \times \sqrt{1 + 2g_m r_b}\right) \quad (1)$$

where $r_b$ is 3.5Ω.

The quantity $g_m$ in equation (1) can be given by equation (2):

$$g_m = \frac{I_C}{V_t} \quad (2)$$

where Vt is the thermal voltage (=kT/q), T is the absolute temperature, and q is the unit charge of the electron. $I_C$ is illustratively set to 4 mA.

Figure 3:
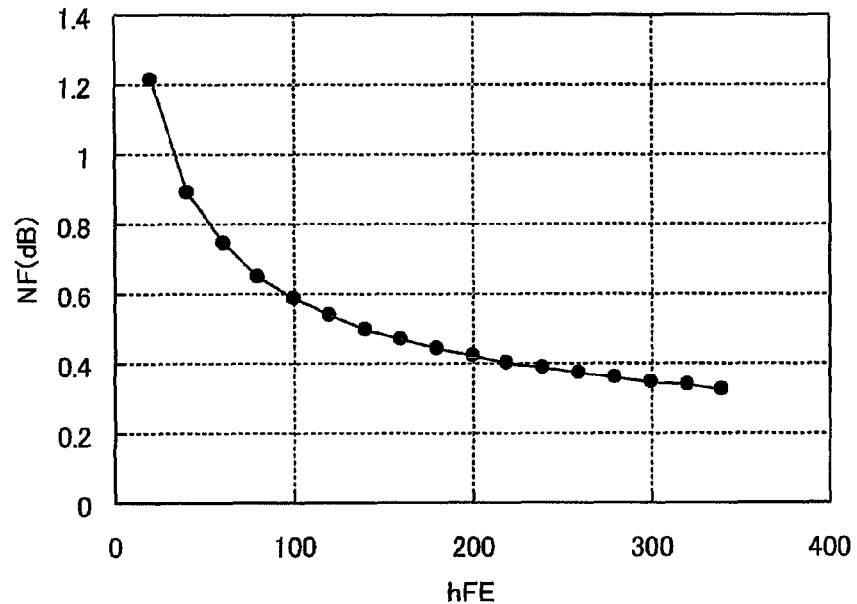
FIG. 3 is a graph for the $h_{FE}$ dependence of NF determined by simulation.

FIG. 3 is a graph for the $h_{FE}$ dependence of NF determined by simulation. The vertical axis represents NF (dB), and the horizontal axis represents DC current amplification factor ($h_{FE}$).

As shown in this figure, NF is generally 1.2 dB for $h_{FE}$=20, generally 0.59 dB for $h_{FE}$=100, and decreased to 0.42 dB for $h_{FE}$=200. Thus, NF decreases as $h_{FE}$ increases. That is, NF is correlated with $h_{FE}$, and therefore an NF screening inspection becomes possible by measuring $h_{FE}$.

Typically, the radio-frequency characteristics of a transistor, such as NF, have a certain distribution, and hence 100% inspection is desired if possible. However, radio-frequency measurement for amplifier circuits after assembly has a problem of requiring expensive measurement equipments and decreasing productivity.

In contrast, in this embodiment, $h_{FE}$ being lower than a prescribed value can be detected by direct measurement in the wafer state so that amplifier circuit chips with high NF can be screened out. This inspection process is simple and highly mass-productive without requiring expensive measurement equipments.

If the amplifying transistor Qa is a SiGe heterobipolar transistor, low NF and high gain are easily achieved. More specifically, using the SiGe epitaxial growth technique, the base layer of the transistor can be made of a SiGe layer. This facilitates reducing the base resistance $r_b$ so that NF given by equation (1) can be reduced and high gain is achieved. Furthermore, $h_{FE}$ is easily increased, which further facilitates reducing NF given by equation (1).

In this case, the first transistor Q1 constituting the current mirror circuit and the amplifying transistor Qa are preferably SiGe heterobipolar transistors.

Thus, for example, the following settings can be easily achieved: the transition frequency $f_T$ is 20 GHz or more, NF at 2 GHz is generally 0.8 dB, the insertion power gain at 2 GHz is 15 dB or more, and $h_{FE}$ is 200 or more.

The SiGe transistor can be formed by using a silicon substrate and conventional processes for integrated circuits. Hence, this embodiment provides an amplifier circuit with improved radio-frequency characteristics and high mass productivity.

Figure 4:
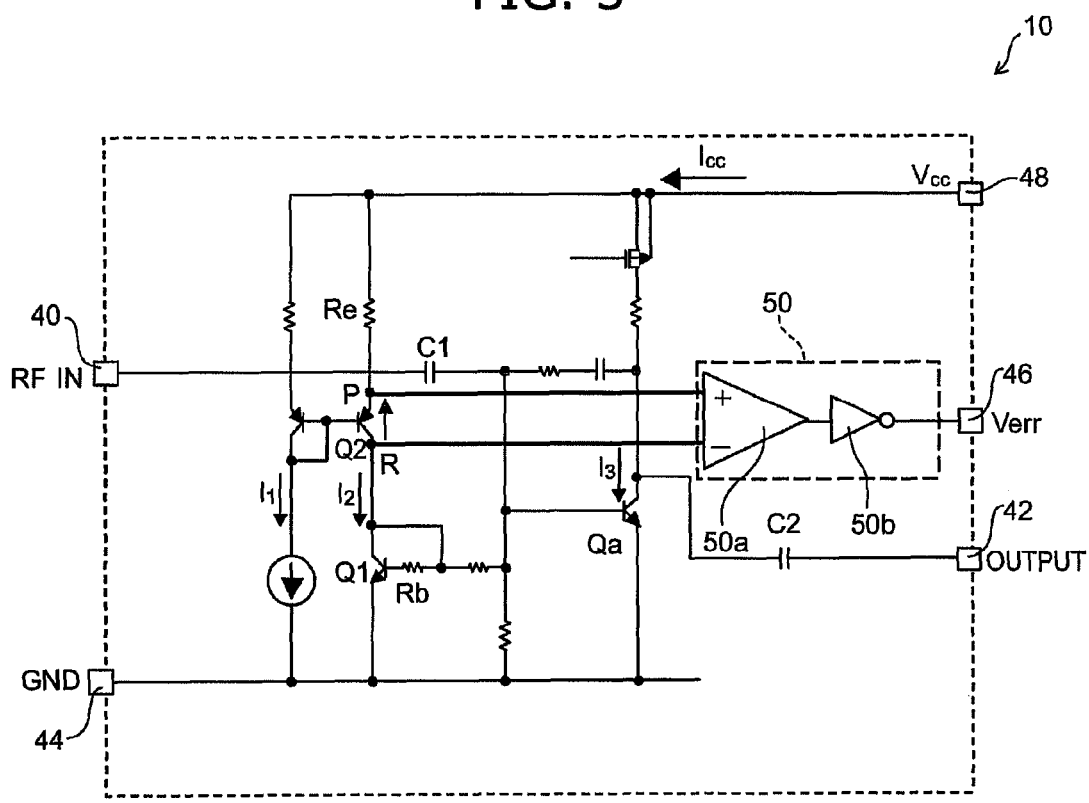
FIG. 4 shows an amplifier circuit according to a second embodiment.

FIG. 4 shows an amplifier circuit according to a second embodiment.

Figure 5A:
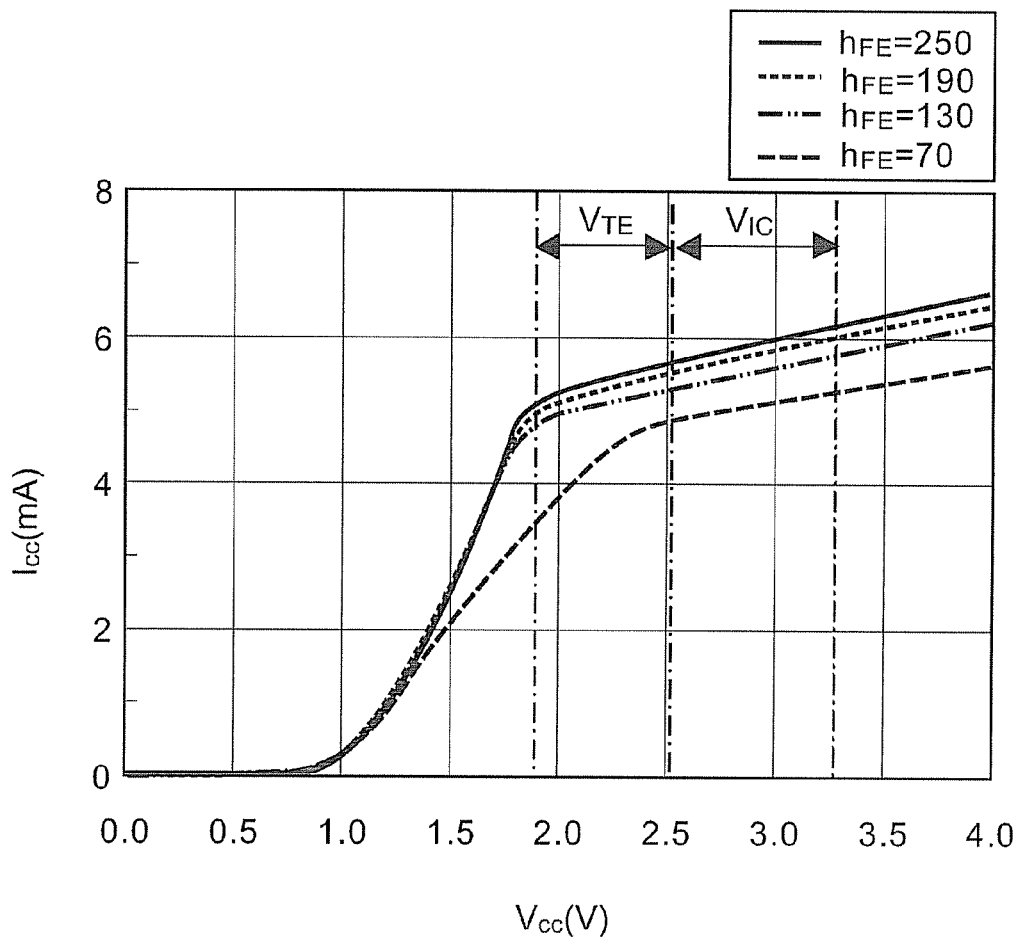
FIGS. 5A and 5B are graphs illustrating the operation of the amplifier circuit.
Figure 5B:
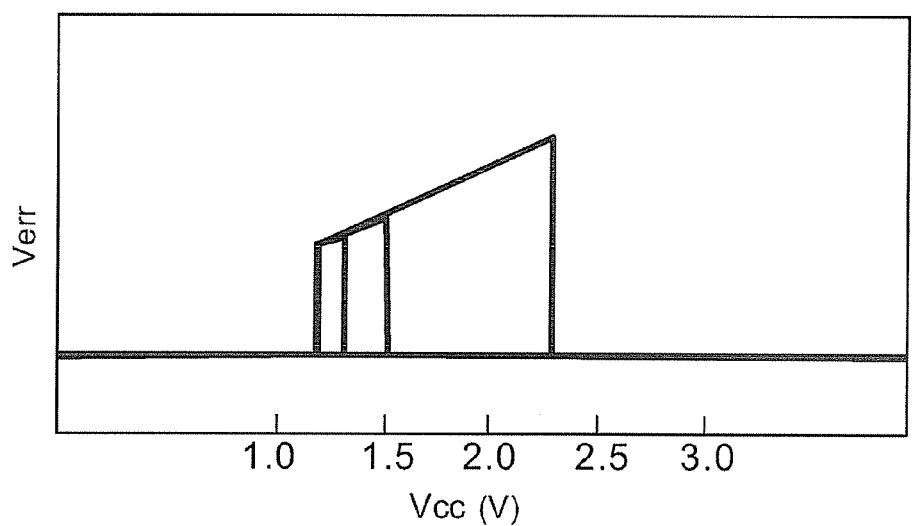

FIGS. 5A and 5B are graphs illustrating the operation of the amplifier circuit, where FIG. 5A is a graph showing the DC characteristics of the amplifier circuit, and FIG. 5B is a graph showing the power supply voltage dependence of the error signal.

This embodiment includes an error signal generating circuit 50 having a comparator 50a and an inverter 50b. The collector (point R) of the second transistor Q2 is connected to the negative input terminal of the comparator 50a, and the emitter (point P) is connected to the positive input terminal of the comparator 50a.

The comparator 50a is assumed to have an offset function. Furthermore, the output of the comparator 50a is inverted by the inverter 50b, and an error signal Verr is outputted to an error signal terminal 46.

When the collector-emitter voltage V1 of the second transistor Q2 is not more than a reference voltage value, the output of the comparator 50a is LOW, and hence the inverter 50b outputs the error signal Verr as shown in FIG. 5B. When Vcc is in the voltage range $V_{TE}$, which is lower than the operating voltage range $V_{IC}$ of the amplifier circuit, if V1 exceeds the reference voltage value, the output of the comparator 50a switches to HIGH, and the output of the inverter 50b is turned to LOW.

Thus, the value of Vcc at which the error signal Verr is turned to LOW corresponds to the value of $h_{FE}$. Hence, amplifier circuits with $h_{FE}$ lower than a desired value can be determined as defective. The comparator 50a can be operated with the reference voltage being offset to, for example, the vicinity of the saturation voltage of the second transistor Q2.

The first and second embodiments provide an amplifier circuit with low NF satisfying the specification and high gain. Such an amplifier circuit can constitute a front end of a mobile electronic device and facilitates downsizing and improving the performance and reliability of the device.

The conductivity type of the transistor is not limited to that in the above embodiments, but may be the opposite conductivity type. Furthermore, the material of the transistor is not limited to Si and SiGe, but the transistor may be a compound semiconductor heterobipolar transistor illustratively made of AlGaAs-based or InP-based materials.

The embodiments of the invention have been described with reference to the drawings. However, the invention is not limited to these embodiments. Those skilled in the art can modify the shape, size, material, layout and the like of the transistor, current source, current mirror circuit, resistor, comparator, inverter, and switch constituting the embodiments of the invention, and such modifications are also encompassed within the scope of the invention unless they depart from the spirit of the invention.

The invention claimed is:

1. An amplifier circuit comprising:
   an amplifying transistor;
   a first transistor having a DC current amplification factor generally equal to the DC current amplification factor of the amplifying transistor and constituting a current mirror circuit in conjunction with the amplifying transistor;
   a current source circuit being operable to supply a current to the first transistor and including a second transistor having opposite conductivity type to the conductivity type of the first transistor; and
   a comparator to which collector potential and emitter potential of the second transistor are inputted,
   the second transistor being operated in a saturation region at a power supply voltage lower than an operating voltage range so that the DC current amplification factor of the amplifying transistor can be detected.

2. The amplifier circuit according to claim 1, wherein the DC current amplification factor of the amplifying transistor being higher than a prescribed value can be detected based on the fact that the output of the comparator switches from a low level to a high level when the difference between the collector potential and the emitter potential of the second transistor exceeds a prescribed voltage value, and the DC current amplification factor of the amplifying transistor being lower than the prescribed value can be detected based on the fact that the output of the comparator is held at the low level when the difference between the collector potential and the emitter potential does not reach the prescribed voltage value.

3. The amplifier circuit according to claim 1, wherein the comparator has an offset voltage such that the prescribed voltage value is set to the vicinity of voltage in the saturation region.

4. The amplifier circuit according to claim 1, wherein resistance between base and collector of the first transistor is increased so that the second transistor is operable in the saturation region.

5. The amplifier circuit according to claim 1, wherein the current source circuit includes a current mirror circuit.

6. An amplifier circuit comprising:
   an amplifying transistor;
   a first transistor having a DC current amplification factor generally equal to the DC current amplification factor of the amplifying transistor and constituting a current mirror circuit in conjunction with the amplifying transistor;
   a current source circuit being operable to supply a current to the first transistor and including a second transistor having opposite conductivity type to the conductivity type of the first transistor;
   a comparator to which collector potential and emitter potential of the second transistor are inputted; and
   an inverter operable to invert an output of the comparator,
   the second transistor being operated in a saturation region at a power supply voltage lower than an operating voltage range so that the DC current amplification factor of the amplifying transistor can be detected.

7. The amplifier circuit according to claim 6, wherein the DC current amplification factor of the amplifying transistor being higher than a prescribed value can be detected based on the fact that the inverter switches an error signal from a high level to a low level when the difference between the collector potential and the emitter potential of the second transistor exceeds a prescribed voltage value, and the DC current amplification factor of the amplifying transistor being lower than the prescribed value can be detected based on the fact that the inverter holds the error signal at the high level when the difference between the collector potential and the emitter potential does not reach the prescribed voltage value.

8. The amplifier circuit according to claim 6, wherein the comparator has an offset voltage such that the prescribed voltage value is set to the vicinity of voltage in the saturation region.

9. The amplifier circuit according to claim 6, wherein resistance between base and collector of the first transistor is increased so that the second transistor is operable in the saturation region.

10. The amplifier circuit according to claim 6, wherein the current source circuit includes a current mirror circuit.

11. The amplifier circuit according to claim 6, wherein the transistors have a size ratio configured so that the current of the amplifying transistor is higher than the current of the first transistor.

12. The amplifier circuit according to claim 11, wherein the amplifying transistor and the first transistor are formed in close proximity to constitute a current mirror circuit.

13. The amplifier circuit according to claim 6, wherein the amplifying transistor and the first transistor are heterobipolar transistors including one of SiGe, AlGaAs, and InP.

* * * * *